US012575201B2

(12) United States Patent
Zang et al.

(10) Patent No.: US 12,575,201 B2
(45) Date of Patent: Mar. 10, 2026

(54) BURIED CHANNEL TRANSISTOR STRUCTURES AND PROCESSES

(71) Applicant: OMNIVISION TECHNOLOGIES, INC., Santa Clara, CA (US)

(72) Inventors: Hui Zang, San Jose, CA (US); Gang Chen, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 536 days.

(21) Appl. No.: 17/571,856

(22) Filed: Jan. 10, 2022

(65) Prior Publication Data

US 2023/0223413 A1     Jul. 13, 2023

(51) Int. Cl.
*H10F 39/00*          (2025.01)
*H10F 39/18*          (2025.01)

(52) U.S. Cl.
CPC ..... *H10F 39/80373* (2025.01); *H10F 39/014* (2025.01); *H10F 39/18* (2025.01); *H10F 39/80377* (2025.01)

(58) Field of Classification Search
CPC ......... H01L 27/14614; H01L 27/14616; H01L 27/14643; H01L 27/14689; H01L 29/66803; H01L 27/14645; H01L 27/1464; H01L 27/14601; H01L 27/14603; H01L 27/14609; H10F 39/80373; H10F 39/18; H10F 39/80377; H10F 39/014; H10D 30/0241; H10D 30/019; H10D 30/0191; H10D 30/0193; H10D 30/0194
See application file for complete search history.

(56)          References Cited

U.S. PATENT DOCUMENTS

| | | | | |
|---|---|---|---|---|
| 2006/0084195 A1* | 4/2006 | Lyu | .................... | H01L 27/14603 |
| | | | | 257/E27.131 |
| 2014/0103437 A1* | 4/2014 | Kapoor | ................. | H01L 29/785 |
| | | | | 438/153 |
| 2018/0138185 A1* | 5/2018 | Hsu | ....................... | H10D 84/859 |
| 2021/0193715 A1* | 6/2021 | McCarten | ........... | H01L 29/4916 |
| 2025/0324733 A1* | 10/2025 | Chang | .............. | H01L 21/02532 |

* cited by examiner

*Primary Examiner* — Jessica S Manno
*Assistant Examiner* — Andrew Chung
(74) *Attorney, Agent, or Firm* — Christensen O'Connor Johnson Kindness PLLC

(57)          ABSTRACT

Transistors include trenches formed in the semiconductor substrate having a first conductive type. The trenches define, in a channel width plane of the transistor, at least one nonplanar substrate structure having a plurality of sidewall portions and a tip portion disposed between the plurality of sidewall portions. An epitaxial overlayer is epitaxially grown on the sidewall portions and the tip portion. A channel doping layer having a doped portion of the semiconductor substrate is formed in the nonplanar substrate structure and enclosed by the epitaxial overlayer. An isolation layer is disposed in the trenches and over the epitaxial overlayer. A gate is disposed on the isolation layer and extends into the trenches.

21 Claims, 10 Drawing Sheets

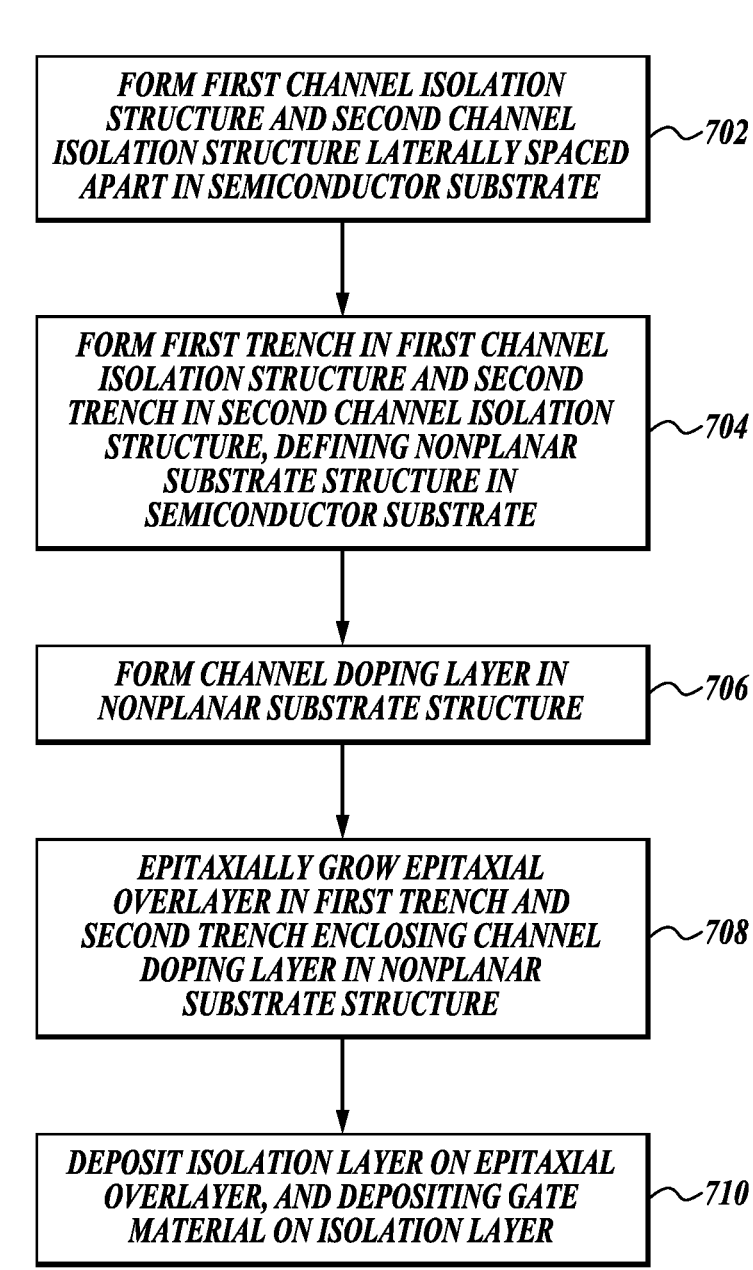

*700*

FORM FIRST CHANNEL ISOLATION STRUCTURE AND SECOND CHANNEL ISOLATION STRUCTURE LATERALLY SPACED APART IN SEMICONDUCTOR SUBSTRATE ~702

FORM FIRST TRENCH IN FIRST CHANNEL ISOLATION STRUCTURE AND SECOND TRENCH IN SECOND CHANNEL ISOLATION STRUCTURE, DEFINING NONPLANAR SUBSTRATE STRUCTURE IN SEMICONDUCTOR SUBSTRATE ~704

FORM CHANNEL DOPING LAYER IN NONPLANAR SUBSTRATE STRUCTURE ~706

EPITAXIALLY GROW EPITAXIAL OVERLAYER IN FIRST TRENCH AND SECOND TRENCH ENCLOSING CHANNEL DOPING LAYER IN NONPLANAR SUBSTRATE STRUCTURE ~708

DEPOSIT ISOLATION LAYER ON EPITAXIAL OVERLAYER, AND DEPOSITING GATE MATERIAL ON ISOLATION LAYER ~710

FORM TRENCH IN SEMICONDUCTOR
SUBSTRATE ADJACENT TO PHOTODIODE       *802*

FORM CHANNEL DOPING LAYER IN
SEMICONDUCTOR SUBSTRATE SURROUNDING       *804*
SIDEWALL PORTIONS OF TRENCH

EPITAXIALLY GROW EPITAXIAL OVERLAYER
ALONG SIDEWALL PORTIONS OF TRENCH       *806*

DEPOSIT ISOLATION LAYER ON EPITAXIAL
OVERLAYER; DEPOSIT GATE MATERIAL       *808*
ON ISOLATION LAYER

BURIED CHANNEL TRANSISTOR STRUCTURES AND PROCESSES

BACKGROUND

This disclosure relates generally to image sensors, and in particular but not exclusively, transistors for image sensors, and methods of manufacturing the same.

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

In image sensors, as the pixel count increases, the bitline setting time also increases due to higher bitline loading. To maintain a high frame rate operation, the transconductance (Gm) of the image sensor source follower transistor can be increased by shortening a length of the source follower channel and/or by increasing an effective width of the charge carrier channel. Similarly, the transconductance (Gm) of the image sensor row select transistor can be increased by shortening a length of the row select channel and/or by increasing an effective width of the row select channel. However, shortening the source follower channel length and/or the row select channel length can lead to deleterious effects, for example short channel effects and undesirable noise, e.g., Random Telegraph Signal (RTS). Widening the source follower channel width and/or the row select channel width can lead to undesirable increases in pixel size.

Nonplanar substrate structures (e.g., fins) having sidewall portions represent one manner of widening the effective channel width. However, etching the sidewall portions introduces surface imperfections in the semiconductor substrate, which creates undesirable noise.

The present disclosure provides solutions for addressing these setbacks.

The above information is presented as background information only to assist with an understanding of the disclosure. No determination has been made, and no assertion is made, as to whether any of the above might be applicable as prior art with regard to the disclosure.

BRIEF DESCRIPTION OF THE SEVERAL VIEWS OF THE DRAWINGS

Non-limiting and non-exhaustive embodiments of the present disclosure are described with reference to the following figures, wherein like reference numerals refer to like parts throughout the various views unless otherwise specified.

FIG. 7 illustrates a method of forming a transistor in accordance with the teachings of the present disclosure.

DETAILED DESCRIPTION

Figure 1:
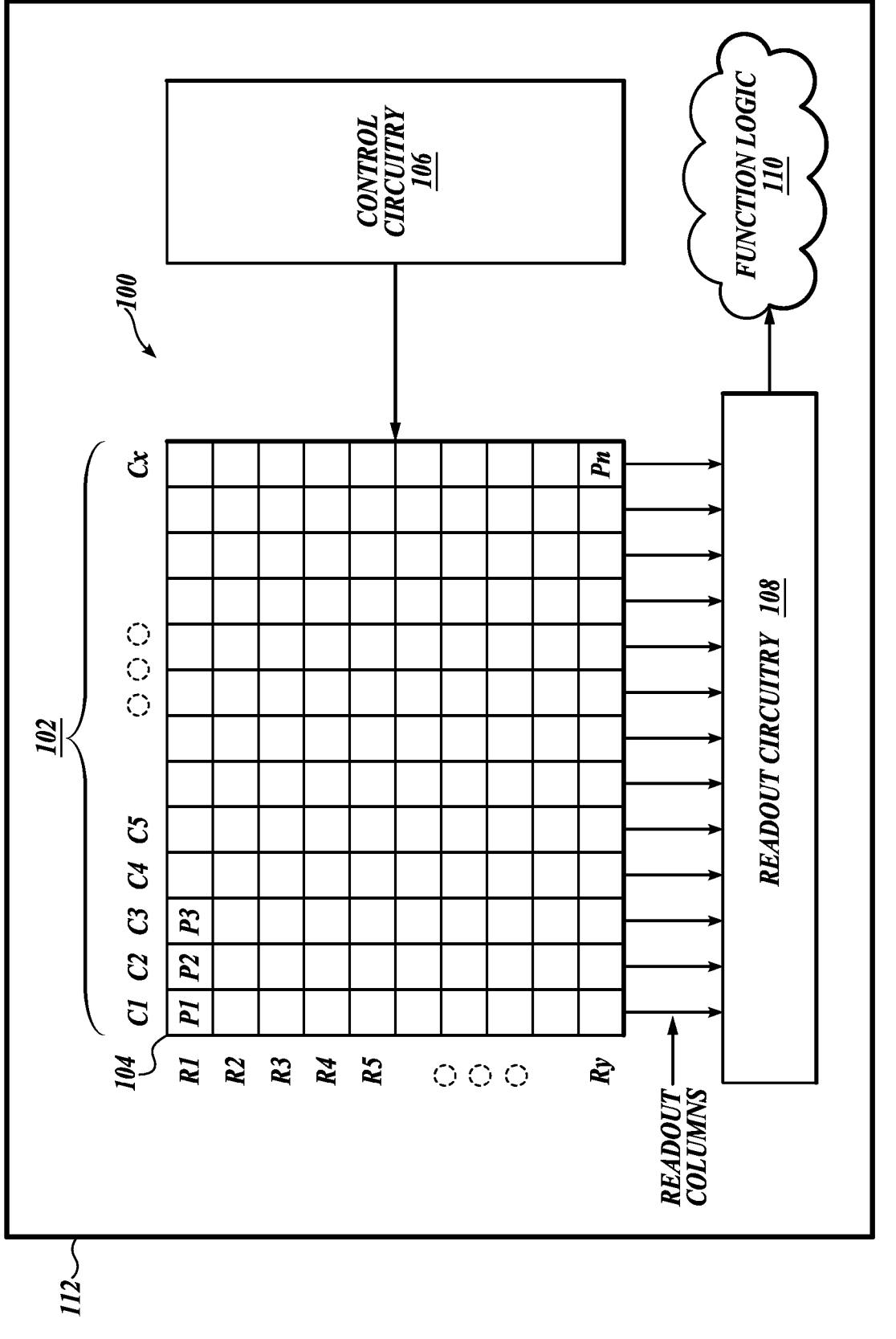
FIG. 1 is a block diagram illustrating an embodiment of an image sensor in accordance with the teachings of the present disclosure.

The present disclosure provides transistors, pixels, image sensors, electronic devices, and methods for manufacturing the same. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "In some embodiments" or "in an embodiment" or "in any embodiment," in various places throughout this specification are not necessarily all referring to the same example. Furthermore, any particular features, structures, and/or characteristics of any embodiments may be combined in any suitable manner in one or more examples.

Spatially relative terms, such as "beneath," "below." "lower," "under." "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "bencath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The present disclosure also provides transistors for image sensors, for example source follower transistors, reset transistors, and row select transistors. To facilitate understanding, the present disclosure describes such transistors in the context of complementary metal-oxide-semiconductor ("CMOS") image sensors. However, it shall be appreciated that the present disclosure shall not be limited to transistors for CMOS image sensors, but may be applied to non-CMOS image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

In the present disclosure, the terms "semiconductor substrate" or "substrate" refer to any type of substrate used for forming electronic devices thereon, including single crystal substrates, semiconductor on insulator (SOI) substrates, doped silicon bulk substrate, and epitaxial film on semiconductor (EPI) substrates and the like. The term semiconductor substrate may also refer to a substrate, formed of one or more semiconductors, subjected to pre-process steps including etching, material deposition and ion implantation that form regions and/or junctions in the substrate. Further, although the various embodiments will be primarily described with respect to materials and processes compatible with silicon-based semiconductor materials (e.g., silicon and alloys of silicon with germanium and/or carbon, indium gallium arsenide), the present technology is not limited in this regard. Rather, the various embodiments can be implemented using any types of semiconductor materials, such as gallium arsenide, indium gallium arsenide, silicon carbide, and other semiconductor materials known to those of skill in the art.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is a diagram illustrating one example of a representative image sensor 100 with a pixel array 102 of pixels 104. As shown, the pixel array 102 is coupled to a control circuitry 106 and to a readout circuitry 108, which is coupled to a function logic 110.

Pixel array 102 is a two-dimensional ("2D") array of pixels 104 (e.g., pixels P1, P2 . . . . Pn). In one embodiment, each pixel 104 is a complementary metal-oxide-semiconductor ("CMOS") imaging pixel. Pixel array 102 may be implemented as either a front side illuminated image sensor array or a backside illuminated image sensor array. In some embodiments, pixels 104 include one or more transistors as described below, including transfer transistors, source follower transistors, row select transistors, and reset transistors. In some embodiments, at least one of the transistors has a vertical gate structure that is of a pillar shape, finger shape, or fin-like shape. For example, in some embodiments, a gate of each transfer transistor has one or more vertical gate electrodes having a pillar shape. For example, a gate of each source follower transistor has one or more vertical gate electrodes having a finger-like or fin-like shape and spaced apart in the channel width direction. As illustrated, the pixels 104 are arranged into rows (e.g., rows R1 to Ry) and columns (e.g., column C1 to Cx) to acquire image data of a person, place, or object, which can then be used to render a 2D image of the person, place, or object.

After a pixel 104 has acquired its image data or image charge, the image data is readout by readout circuitry 108 and transferred to function logic 110. Readout circuitry 108 may include amplification circuitry, e.g., a differential amplifier circuitry, analog-to-digital ("ADC") conversion circuitry, or otherwise. In some embodiments, the readout circuitry 108 may readout a row of image data at a time along readout column lines (illustrated) or may readout the image data using a variety of other techniques (not illustrated), such as a serial readout or a full parallel readout of all pixels simultaneously.

Control circuitry 106 is coupled to pixels 104 and includes logic and memory for controlling operational characteristics of pixels 104. For example, control circuit 106 may generate voltage control signals (e.g., transfer signal and cut off signal) controlling the operation of the transfer structure associated with each pixel 104. For example, control circuitry 106 may generate a shutter signal for controlling image acquisition. In some embodiments, the shutter signal is a global shutter signal for simultaneously enabling all pixels 104 to simultaneously capture their respective image data during a single acquisition window. In some embodiments, the shutter signal is a rolling shutter signal whereby each row, column, or group of pixels 104 is sequentially enabled during consecutive acquisition windows.

Function logic 110 includes logic and memory for storing the image data or even manipulating the image data by applying post image effects (e.g., crop, rotate, remove red eye, adjust brightness, adjust contrast, or otherwise).

In any embodiment, any one or more of image sensor 100, pixel array 102, or pixels 104 may be part of a semiconductor device embodied in an electronic device 112 or, e.g., a smartphone, a camera, head-mount device, and the like.

Figure 2:
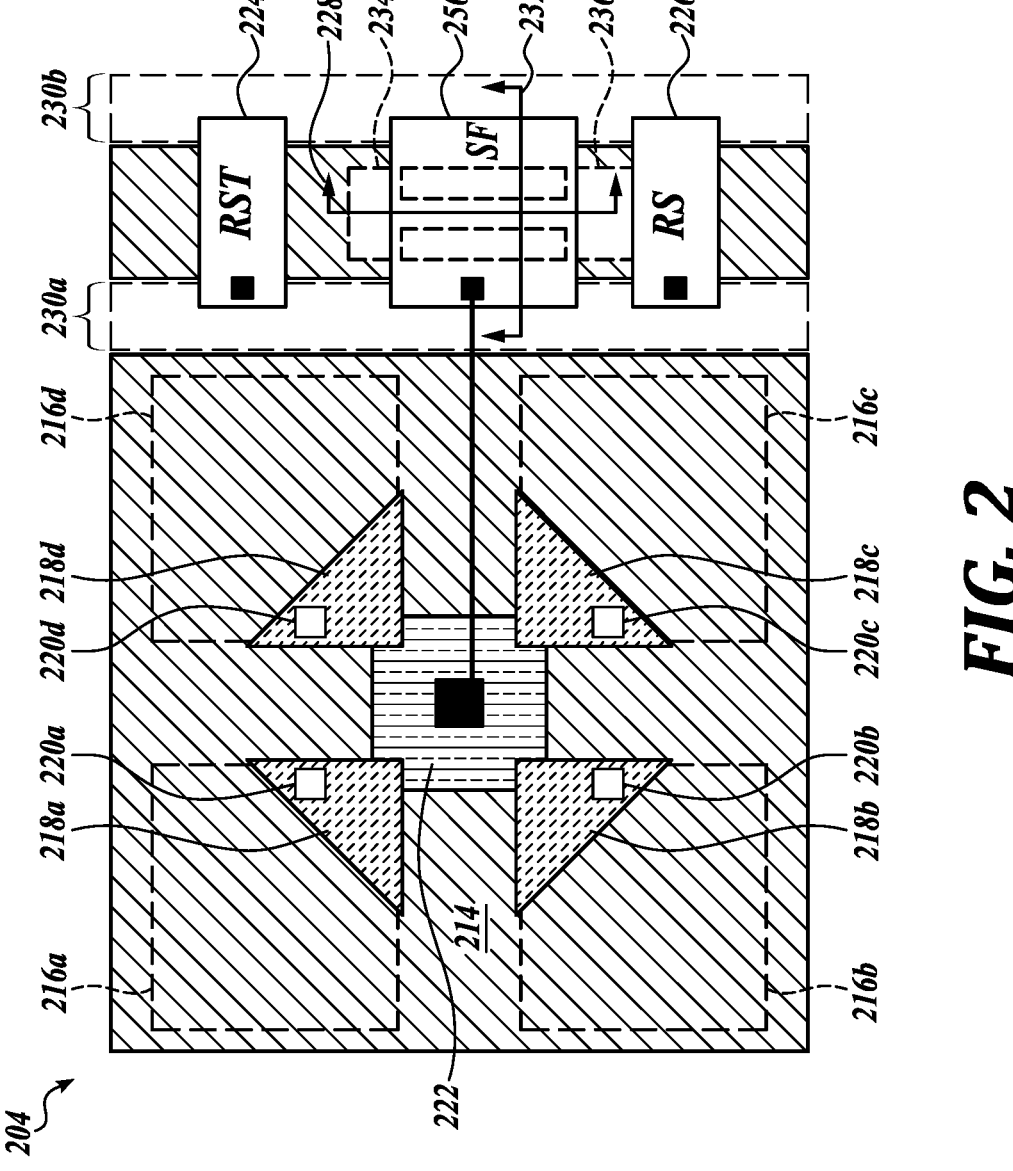
FIG. 2 shows an embodiment of a layout of a pixel in accordance with the teachings of the present disclosure.

FIG. 2 shows one representative example of a layout of a simplified pixel 204, which may be utilized in an image sensor such as the image sensor 100 of FIG. 1, which itself may be integrated into an electronic device such as a smart phone. The pixel layout shown in FIG. 2 is representative, and the teachings of the present disclosure may be embodied in many other pixel layouts.

The pixel 204 has a plurality of photodiodes 216a-d arranged in a "four-shared" configuration. Transfer transistors 218a-d each have a planar gate and a respective vertical transfer gate 220a-d extending from the planar gate that facilitates charge transfer from one of the corresponding photodiodes 216a-d to a floating diffusion 222. The source follower transistor 250 couples to the floating diffusion 222 and a row select transistor 226. The reset transistor 224 is coupled to photodiodes 216a-d and floating diffusion 222.

Floating diffusion 222 may be coupled to planar transfer gates of transfer transistors 218a-d and to a gate SF of source follower transistor 250 through one or more metal interconnects, and operates to aggregate charge carriers from photodiodes 216a-d (via one or more transfer transistors 218a-d) and to output a corresponding voltage to the gate SF of source follower transistor 250 for signal read out.

Photodiodes 216a-d are each configured to generate and accumulate charges in response to incoming light received during an integration period of the image sensor. Charges, e.g., photoelectrons, accumulated in a charge accumulation region of photodiodes 216a-d (e.g., a source of corresponding transfer transistors 218a-d), for example during the integration period of the image sensor, can be selectively transferred to the floating diffusion 222 (e.g., drain of transfer transistors 218a-d) during the charge transfer period of the image sensor depending on voltage applied to the planar gate of transfer transistors 218a-d. In some embodiments, the photodiodes 216a-d have a pinned photodiode configuration.

Photodiodes 216a-d may have various configurations including, but not limited to, a pinned photodiode configuration and a partially pinned photodiode configuration. In some embodiments, each of photodiodes 216a-d includes a pinning layer and a photodiode doped region, where the pinning layer has a conductivity opposite to photodiode region (e.g., the pinning layer is a p-type doped layer when photodiode region is n-type) and is disposed between a front surface of semiconductor substrate 214 and the pinning layer is coupled to a ground.

The reset transistor 224 is configured to reset (e.g., discharge or charge) coupled photodiodes 216a-d and floating diffusion 222 to a preset voltage e.g., a supply voltage VDD, under control of a reset signal received at the gate RST of reset transistor 224 during a reset period. The reset transistor 224 is further coupled to the photodiodes 216a-d through corresponding transfer transistors 218a-d.

The source follower transistor 250 is coupled between a power line and the row select transistor 226, and modulates the image signal output based on the voltage output by floating diffusion 222, where the image signal corresponds to the amount photoelectrons accumulated in charge accumulation region of coupled photodiodes 216a-d during the integration period at the gates thereof. The source follower transistor 250 amplifies the image signal based upon a voltage received at the gate thereof. In some embodiments, the drain 234 of source follower transistor 250 and the drain of reset transistor 224 are coupled to a same power line receive common supply voltage Vad. As described below in detail, the present disclosure provides transistor structures having increased effective channel width in a channel width plane (e.g., when viewed in channel width plane section plane 232), which also reduce noise such as RTS for improved performance. For clarity, a "channel width plane" is a plane extending across a channel through which charge carriers flow between a source and a drain of a transistor (e.g., source 234 and drain 236 of source follower transistor 250). In other words, the channel width plane section plane 232 is perpendicular to the direction of current flow. By comparison, a channel length plane or channel length direction (such as channel length section plane 228) is oriented perpendicular to the channel width plane and parallel to the direction of current flow.

Row select transistor 226 selectively couples the output of the source follower transistor 250 (e.g., image signal) to the readout column line under control of a row select signal received at a gate RS of row select transistor 226.

The region where source follower transistor 250, reset transistor 224, and row select transistor 226 are disposed can be referred to as a transistor region of the pixel 204. By comparison, the region where the photodiodes 216a-d, transfer transistors 218a-d, and floating diffusion 222 are disposed may be referred to as the active region. Isolation structures 230a, b (e.g., shallow channel isolation trench structures having a depth of about 150 nm to about 400 nm with respect to a front side of the semiconductor substrate 214) separates the active region from the transistor region and extends along a channel length direction (parallel to the channel length section plane 228). In some embodiments, the isolation structures 230a-b form part of the inventive transistors described below. Some embodiments include a plurality of isolation structures 230a-b, i.e., one on each side of the transistor region.

Channel isolation structures 230a, b electrically isolate transistor elements in the device transistor area from photodiodes 216a-d, transfer structures 218a-d, and floating diffusion 222 in the active pixel area. In some embodiments, channel isolation structures 230a, b can be dielectric-filled trench isolation structures such as shallow channel isolation trench structures or deep channel isolation trench structures. In some embodiments, channel isolation structures 230a, b can be doped well isolation structures having a conductive type opposite to photodiodes 216a-d. In some embodiments, channel isolation structures 230a, b can be a combination of dielectric-filled trench isolation structures and doped well isolation structures.

In some embodiments, the pixel 204 may include additional elements that are not described in detail herein, such as one or more additional transistors, capacitors, floating diffusions, or the like. In some embodiments, the transfer gate of each transfer transistor 218a-d utilizes planar transfer gate without corresponding vertical transfer gates 220a-d.

It shall be appreciated that the pixel layout of FIG. 2 is representative, not limiting. In some embodiments, the pixel includes a single photodiode, transfer transistor, and floating diffusion. The transistors described herein may be utilized in any pixel arrangement.

In operation, during the integration period of the image sensor (also referred to as an exposure or accumulation period), photodiodes 216a-d absorb incident light on the respective charge accumulation regions. The photogenerated charges accumulated in the charge accumulation regions indicate the amount of light incident on the charge accumulation regions. After the integration period, a transfer signal (e.g., a positive biasing voltage) is applied, for example from the control circuitry 106 of FIG. 1 to the transfer gate (vertical transfer gates 220a-d) of transfer transistors 218a-d, causing the transfer transistors 218a-d to turn on and to transfer the photogenerated charges from the coupled photodiodes 216a-d to the floating diffusion 222 during the charge transfer period. The source follower transistor 250 operatively generates the image signal based on voltage outputted by the coupled floating diffusion 222. The row select transistor 226 coupled to the source follower transistor 250 then selectively couples the image signal onto a column bit line upon receiving a row select signal during a read out period for signal read out, for example by readout circuitry 108 as well as subsequent image processing.

Figures 3A, 3B:
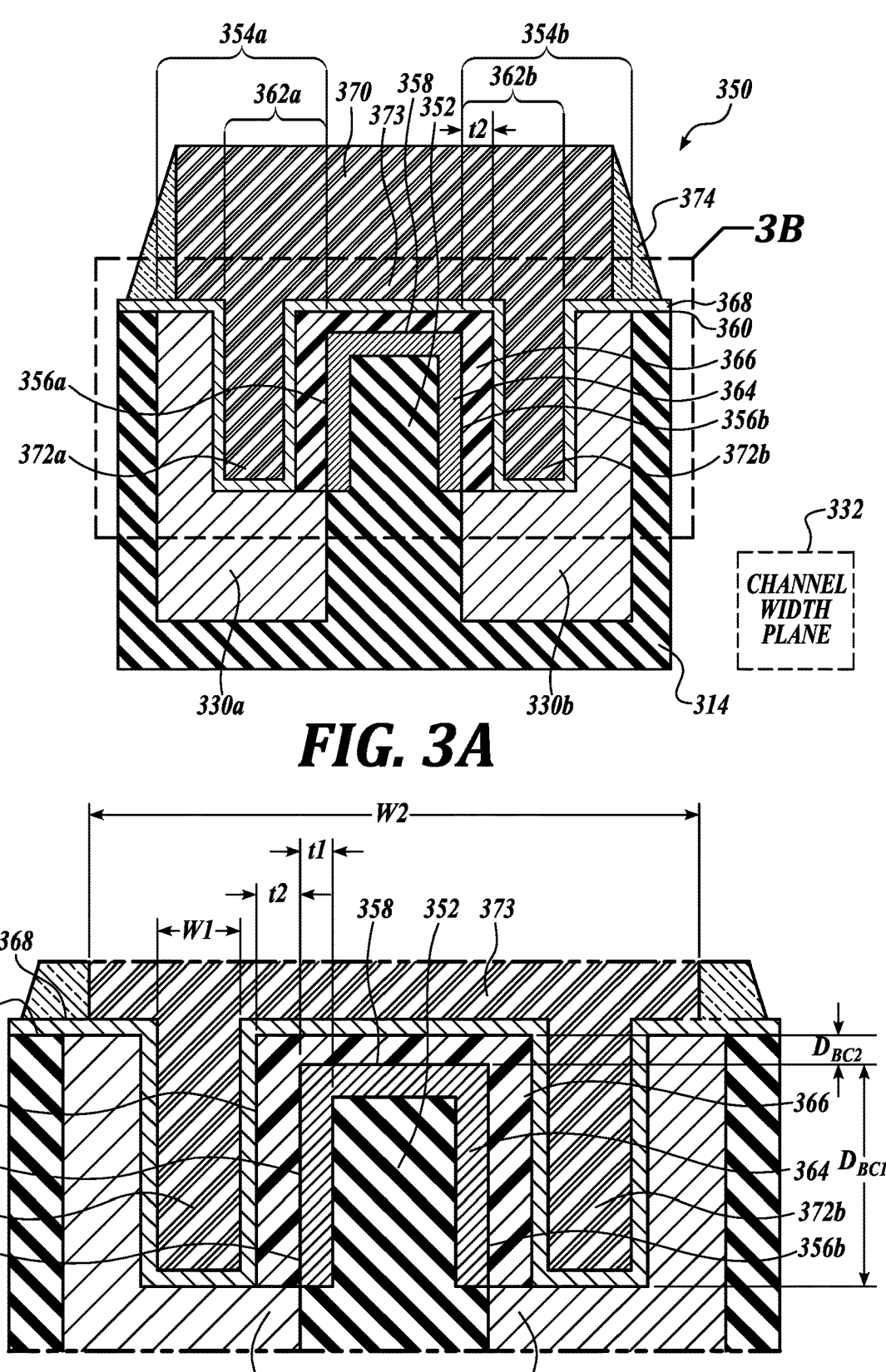
FIG. 3A shows a cross section of one embodiment of a transistor in a channel width plane in accordance with the teachings of the present disclosure.
FIG. 3B shows a detail view of a portion of the transistor of FIG. 3A.
Figure 3C:
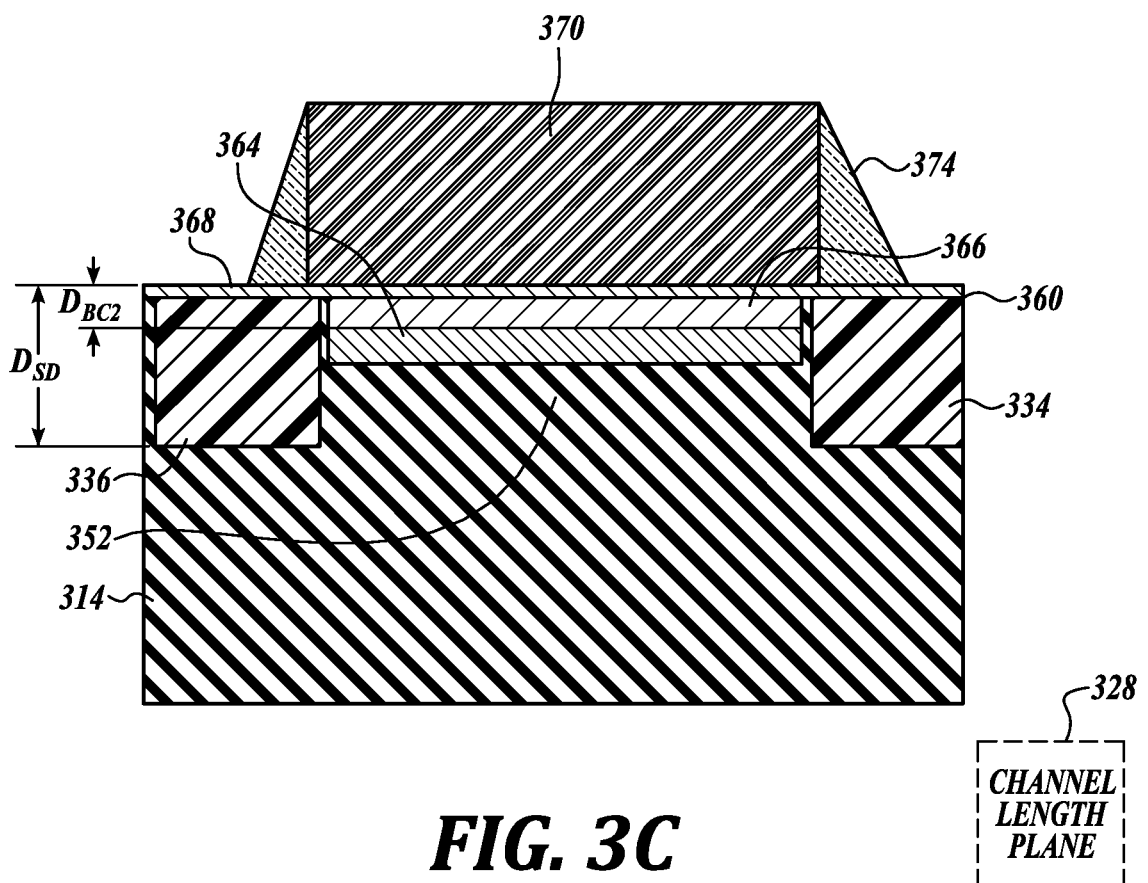
FIG. 3C shows a cross section of the transistor of FIG. 3A, in a channel length plane.

FIG. 3A shows a section view of a representative source follower transistor 350 according to a representative embodiment of the present disclosure. The section view of FIG. 3A is taken in a channel width plane 332. Compare FIG. 3C, showing the source follower transistor 350 in channel length plane 328. The source follower transistor 350 is formed within the transistor region associated with a pixel, which in some embodiments includes a reset transistor, a row select transistor, and/or other transistors not shown in FIG. 3A. See, e.g., FIG. 2. The pixel forms part of an image sensor, which itself may form part of an electronic device.

As described in detail below, the source follower transistor 350 has a structure that reduces channel noise by mitigating the effects of surface imperfections caused by fabrication processes, namely plasma etching. Although FIG. 3A-3B describe inventive structures in the context of a source follower transistor, the structure is applicable to other transistors as well, e.g., reset transistors, a row select transistors, and transfer transistors having vertical transfer gates.

Semiconductor substrate 314 may be a silicon substrate, a silicon on insulator substrate, or the like having one or more doped silicon portions, such as N-type doped silicon portions and/or P-type doped silicon portions. The source follower transistor 350 of FIG. 3A shows a P-type well portion of semiconductor substrate 314 having a first conductive type (i.e., P-type).

The source follower transistor 350 has at least one fin-shaped or finger-shaped nonplanar substrate structure 352 having a plurality of sidewall portions 356a, b and a tip portion 358 disposed between the sidewall portions 356a, b. The nonplanar substrate structure 352 is part of the semiconductor substrate 314. The sidewall portions 356a, b of nonplanar substrate structure 352 are spaced apart in the channel width plane 332 and connected by the tip portion 358. In some embodiments, the sidewall portions 356a, b and tip portion 358 form a U-shape or square wave profile in the channel width plane 332. The nonplanar substrate structure 352 may be defined by a plurality of trenches 354a, b formed in the surrounding semiconductor substrate 314. As shown in FIG. 3C, the nonplanar substrate structure 352 extends in the channel length direction between a source 334 and a drain 336. In any embodiment, the sidewall portions 356a, b extend vertically into the semiconductor substrate 314, i.e., perpendicular to the front surface 360. Each trench 354a, b has a depth of about 100 nm to about 500 nm relative to the front surface 360 of the semiconductor substrate 314 and is formed, for example, by etching the semiconductor substrate 314 (such as with a SiCoNi process).

In use, when a voltage greater than or equal to a threshold voltage of the source follower transistor 350 is applied to a gate of the source follower transistor 350, charge carriers move from a source to a drain through a charge carrier channel formed within the region of nonplanar substrate structure 352. In some embodiments, this charge carrier channel has a shape that generally follows a cross-sectional shape or contour of the nonplanar substrate structure 352 in the channel width plane 332, e.g., a U-shaped or three-sided channel. Accordingly, the source follower transistor 350 can be said to have both a charge carrier channel that comprises a planar charge carrier channel section in any channel length plane in parallel connection with a non-planar charge carrier channel in any channel width plane 332, which advantageously increases transconductance without increasing device width.

Additional features of the nonplanar substrate structure 352 are described below following introduction of other elements of the source follower transistor 350.

Channel isolation structures 330a, b are respectively formed in trenches 354a, b in order to isolate the charge carrier channel from other pixel elements such as an active region comprising a photodiode, transfer gate, and floating diffusion. In some embodiments, channel isolation structures 330a, b are formed by filling trenches 354a, b with a dielectric material such as silicon oxide material. In some embodiments, channel isolation structures 330a, b are shallow channel isolation trench structures having a having a depth of about 150 nm to about 400 nm with respect to front surface 360 of the semiconductor substrate 314.

A trench 362a, b is formed in each channel isolation structure 330a, b, respectively, to a depth of about 100 nm to about 350 nm relative to the front surface 360. These trenches 362a, b reveal sidewall portions of the nonplanar substrate structure 352 and provide recesses into which an epitaxial overlayer of the nonplanar substrate structure 352 grows (as described below), and also into which the vertical fingers of a gate extend.

Turning to FIG. 3B, additional features of the nonplanar substrate structure 352 will now be described.

The nonplanar substrate structure 352 includes a channel doping layer 364 formed therein (e.g., through an ion implantation process) in order to form a charge carrier channel between the source 334 and drain 336 (see FIG. 3C). The semiconductor substrate 314 has a first conductive type (in this case, P-type) in the illustrated embodiment, the channel doping layer 364 has a second conductive type (in this case, N-type), wherein the second conductive type is opposite the first conductive type. In some embodiments, the channel doping layer 364 is implanted into the sidewall portions 356a, b and tip portion 358 of the nonplanar substrate structure 352 adjacent to trenches 354a, b for the channel isolation structures 330a, b. Accordingly, in any embodiment, the channel doping layer 364 has a shape that follows a profile of the nonplanar substrate structure 352, i.e., a three-sided U-shape with two parallel legs and a perpendicular tip portion in this embodiment. In some embodiments, the channel doping layer 364 has a shape that also follows the trench sidewall profile of trenches 354a, b. In embodiments having a plurality of nonplanar substrate structures, the shape of the channel doping layer 364 may have a different shape that continuously follows the profile of the nonplanar substrate structures. See, e.g., FIG. 5A and FIG. 5B. In some embodiments, the channel doping layer 364 has an ion concentration of a dopant or impurity (e.g., phosphorus (P) or arsenic (As)) which is less than an ion concentration of the source 334 and the drain 336 associated with source follower transistor 350 formed at opposite ends of the nonplanar substrate structure 352 in a channel length direction. In some embodiments, the channel doping layer 364 is doped with a dopant having the second conductive type at a dosage of about $E11-E12/cm^2$.

In any embodiment, the channel doping layer 364 has a thickness 11 extending toward a center of the nonplanar substrate structure 352 from the sidewall portions 356a, b of about 1 nm to about 10 nm, about 2 nm to about 10 nm, about 3 nm to about 10 nm, about 4 nm to about 10 nm, about 5 nm to about 10 nm, about 6 nm to about 10 nm, about 7 nm to about 10 nm, about 8 nm to about 10 nm, about 9 nm to about 10 nm, about 1 nm to about 9 nm, about 1 nm to about 8 nm, about 1 nm to about 7 nm, about 1 nm to about 6 nm, about 1 nm to about 5 nm, about 1 nm to about 4 nm, about 1 nm to about 4 nm, about 1 nm to about 3 nm, or about 1 nm to about 2 nm.

An epitaxial overlayer 366 is further formed in the trenches 354a, b and around an outside profile of nonplanar substrate structure 352, thereby enclosing the channel doping layer 364 on all sides of the nonplanar substrate structure 352. The epitaxial overlayer 366 is formed of an overlayer material epitaxially grown on the sidewall portions 356a, b and the tip portion 358 of nonplanar substrate structure 352. For example, the epitaxial overlayer 366 can be epitaxially grown using the sidewall portions 356a, b and the tip portion 358 of nonplanar substrate structure 352 as seed layer. The epitaxial overlayer 366 encloses the channel doping layer 364 and advantageously reduces RTS and other noise effects because its relatively smooth surface, formed by epitaxial growth following defects cleaning and curing process, substantially eliminates defects induced by plasma etching of trenches 354a, b and trenches 362a, b, leading to better charge carrier mobility through the channel doping layer 364. In other words, without the epitaxial overlayer 366, the sidewall portions 356a, b would include surface defects formed of dangling bonds caused by damage to the crystalline structure of semiconductor substrate 314 (e.g., damage to silicon lattice structure), and therefore on the nonplanar substrate structure 352 from etching of trenches 354a, b and trenches 362a, b. These surface defects lead to RTS and other deleterious effects.

In some embodiments, the overlayer material for epitaxial overlayer 366 is a same semiconductor material as the semiconductor substrate 314. In some embodiments, epitaxial overlayer 366 and semiconductor substrate 314 comprise silicon material. For example, semiconductor substrate 314 is a single crystal silicon (e.g., a wafer or the like), and epitaxial overlayer 366 is epitaxially grown silicon. The epitaxial overlayer 366 may be grown such that it is an extension the nonplanar substrate structure 352. However, the epitaxial overlayer 366 may be distinguished from an original portion of the nonplanar substrate structure 352 (i.e., a portion which existed prior to the growth of the epitaxial overlayer 366) by the presence of the channel doping layer 364, the outer boundary 355 of which marks the beginning of the epitaxial overlayer 366. Restated, the channel doping layer 364 is disposed between the epitaxial overlayer 366 and an original portion of the nonplanar substrate structure 352. Another way to distinguish the epitaxial overlayer 366 is that it extends over a portion of the channel isolation structures 330a, b as described below.

In some embodiments, the epitaxial overlayer 366 is formed using an ultra-high vacuum chemical vapor deposition process or similar process to deposit the overlayer material on the semiconductor substrate 314. In some embodiments, the epitaxial overlayer 366 has a thickness 12 in the channel width plane 332 between the isolation layer (described below) and channel doping layer 364 of about 1 nm to about 30 nm, about 1 nm to about 25 nm, about 1 nm to about 20 nm, about 1 nm to about 15 nm, about 1 nm to about 10 nm, about 1 nm to about 5 nm, about 5 nm to about 30 nm, about 10 nm to about 30 nm, about 15 nm to about 30 nm, about 20 nm to about 30 nm, or about 25 nm to about 30 nm. In any of the foregoing examples, the thickness 12 of the epitaxial overlayer 366 may be measured between the outer boundary 355 of the channel doping layer 364 and an outermost boundary 357 of the epitaxial overlayer 366 in the channel width plane 332.

Portions of the epitaxial overlayer 366 disposed along sidewalls 356a, b extend to the depth DBC1, which may be about 100 nm to about 350 nm, about 100 nm to about 300 nm, about 100 nm to about 250 nm, about 100 nm to about 200 nm, about 150 nm to about 350 nm, about 200 nm to about 350 nm, about 250 nm to about 350 nm, or about 300 nm to about 350 nm relative to the top of tip portion 358.

By comparison, the epitaxial overlayer 366 extends along top of the tip portion 358 from a depth DBC2 to the front surface 360 of the semiconductor substrate 314. The depth DBC2 with respect to front surface 360, may be about 1 nm to about 30 nm, about 1 nm to about 25 nm, about 1 nm to about 20 nm, about 1 nm to about 15 nm, about 1 nm to about 10 nm, about 1 nm to about 5 nm, about 5 nm to about 30 nm, about 10 nm to about 30 nm, about 15 nm to about 30 nm, about 20 nm to about 30 nm, or about 25 nm to about 30 nm. The depth DBC2 may also refer to as the thickness of the portion of epitaxial overlayer 366 over the top of the tip portion 358.

Given its formation on the sidewall portions 356a, b and tip portion 358, the epitaxial overlayer 366 has a shape that follows a profile of the nonplanar substrate structure 352 in the channel width plane 332. In some embodiments, this shape is a three-sided U-shape or square-wave shape as shown in FIG. 3A. In embodiments having a plurality of nonplanar substrate structures, the shape of the epitaxial overlayer 366 may have a different shape that continuously follows the profile of the nonplanar substrate structures. See, e.g., FIG. 5A and FIG. 5B.

As shown best in FIG. 3B, the epitaxial overlayer 366 extends over a portion of each of the channel isolation structures 330a, b on opposite sides of the nonplanar substrate structure 352. The extent to which the epitaxial overlayer 366 extends over the channel isolation structures 330a, b is equal to the thickness of the epitaxial overlayer 366 as described above. When viewed as a whole, the nonplanar substrate structure 352 of FIG. 3A, B has a T-shape as a result of this characteristic, with the epitaxial overlayer 366 forming two "arms" or "ledges" extending away in the channel width plane 332 over the respective channel isolation structures 330a, b from opposite sides of a centerline of the nonplanar substate structure 352. In other embodiments having a plurality of nonplanar substrate structures, the epitaxial overlayer 366 may have a different shape; however, it would still extend over the adjacent channel isolation structures.

Returning to FIG. 3A, an isolation layer 368 is disposed in the trenches 362a, b and on front surface 360 adjacent to the nonplanar substrate structure 352 (in particular, on the epitaxial overlayer 366), thereby separating the semiconductor substrate 314 from a gate 370. The isolation layer 368 may be a continuous layer coated conformally on the epitaxial overlayer 366. Accordingly, the isolation layer 368 functions as a gate isolation layer, and comprises a dielectric material, such as a silicon oxide or high-k material, e.g., a material having a dielectric constant that is greater than about 3.9 (e.g., $Al_2O_3$ or $HfO_2$).

Figure 4A:
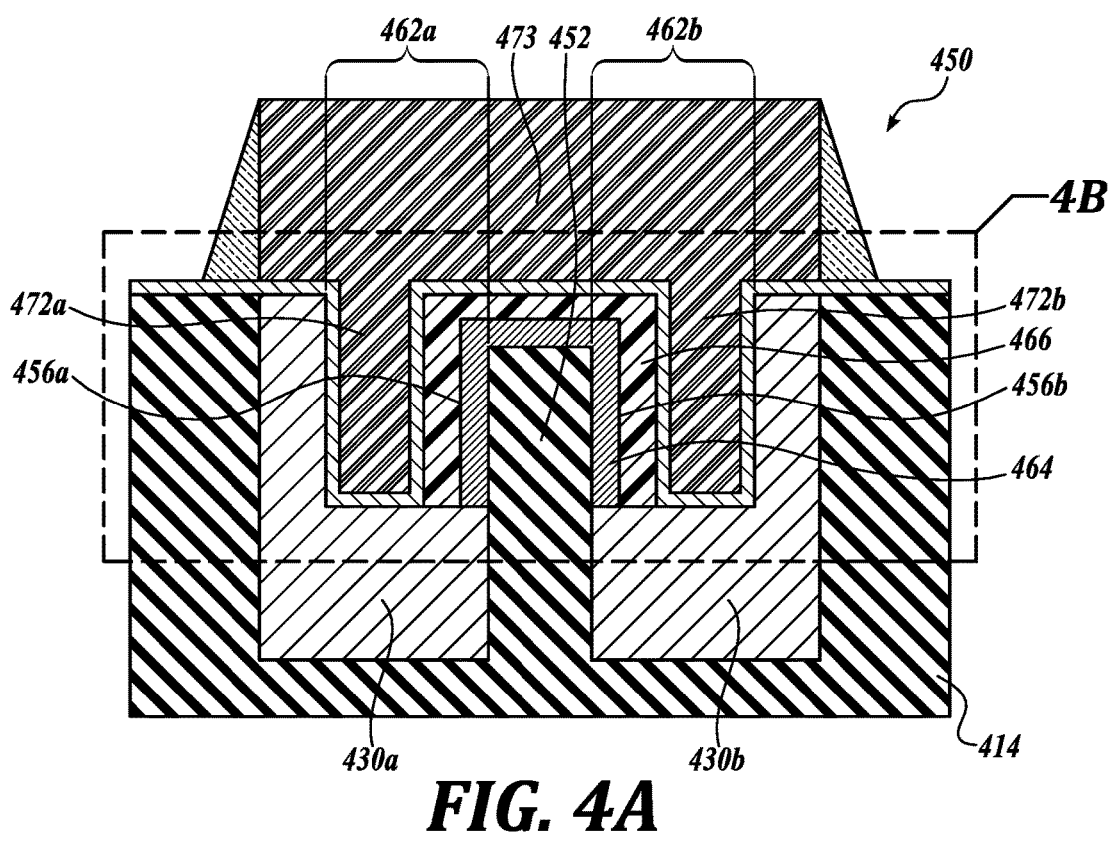
FIG. 4A shows a cross section of an alternative embodiment of a transistor in accordance with the teachings of the present disclosure.

The gate 370 is disposed on the isolation layer 368, with parallel and finger-like vertical gate electrodes 372a, b ("fingers") extending into the trenches 362a, b, respectively, from a planar gate portion 373. The planar gate portion 373 of gate 370 is disposed on the front surface 360 of the semiconductor substrate 314 opposite the isolation layer 368. In the illustrated embodiment, the planar gate portion 373 extends partially over each of the channel isolation structures 330a, b. In other embodiments (e.g., as shown in FIG. 4A), the planar gate portion 373 extends entirely over the channel isolation structures 330a, b. In some embodiments, the gate 370 comprises a polysilicon or a metal. Each of the electrodes 372a, b may extend in a channel length direction between a source and a drain formed in the semiconductor substrate 314. In any embodiment, each of the first electrode 372a and the second electrode 372b has a first gate width $W_1$ along the channel width plane 332, wherein the first gate width is less than a width $W_2$ of the planar gate portion 373 in the channel width plane 332. In any embodiment, the first gate width $W_1$ of each of the first electrode 372a and the second electrode 372b is less than a first trench width of corresponding trenches 354a, 354b. In any embodiment, the first gate width $W_1$ of each of the first electrode 372a and the second electrode 372b is less than a second trench width of corresponding trenches 362a, 362b. In embodiments, the planar gate, first electrode, and second electrode are electrically connected to a floating diffusion in an active region of a pixel.

An optional spacer 374 is formed around the gate 370 on front surface 360 of the semiconductor substrate 314, e.g., around planar gate portion of the gate 370, in a configuration that improves current and voltage parameters of the source follower transistor 350. In some embodiments, the spacer 374 surrounds the gate 370. In some embodiments, spacer 374 is formed of a dielectric material similar to the isolation layer 368. In some embodiments, spacer 374 is a single layer or multi-layer stack structure formed of oxide, nitride or a combination thereof.

FIG. 3C shows a section view of the source follower transistor 350 along the channel length plane 328 extending through a center of the nonplanar substrate structure 352 (analogous to channel length section plane 228 of FIG. 2). Restated, the channel length plane 328 extends through tip portion 358 of the nonplanar substrate structure 352. The portion of the epitaxial overlayer 366 shown in FIG. 3C (i.e., the portion extending through the tip portion 358) extends from the front surface 360 of the semiconductor substrate 314 to the depth $D_{BC2}$. Depth $D_{BC2}$ may correspond to the implant depth of channel doping layer 364 disposed along the tip portion 358 with respect to front surface 360, and is generally less than a junction depth $D_{SD}$ associated with the source 334 and drain 336. The epitaxial overlayer 366 is between the front surface 360 of the semiconductor substrate 314 and the channel doping layer 364. It is appreciated that in some embodiments, some of the implanted dopant or impurities of the channel doping layer 364 may diffuse at least to a partial extent into the epitaxial overlayer 366, for example during an annealing process, such that a portion of the channel doping layer 364 may be also formed in the epitaxial overlayer 366. Restated, in some embodiments, at least part of the epitaxial overlayer 366 contains a same dopant as the channel doping layer 364 (e.g., at a lower concentration in the epitaxial overlayer 366 than the channel doping layer 364). Stated differently, in some embodiments, the channel doping layer 364 extends into the epitaxial overlayer 366. The thickness of the portion of channel doping layer 364 disposed proximate to tip portion 358 of nonplanar substrate structure 352 and between source 334 and drain 336 may have thickness substantially the same as the portion of channel doping layer 364 disposed proximate to tip portion 358 of nonplanar substrate structure 314 along channel width plane. The implanted depth of channel doping layer 364 and a junction depth of portion of the channel doping layer 364 disposed proximate to tip portion 358 of nonplanar substrate structure 352 and between source 334 and drain 336 may be less than junction depth $D_{SD}$ of the source 334 and drain 336. By comparison, the portions of the epitaxial overlayer 366 disposed along sidewalls 356a, b extend to the depth $D_{BC1}$ (see FIG. 3B) that is at greater depth than the depth $D_{BC2}$.

Figure 4B:
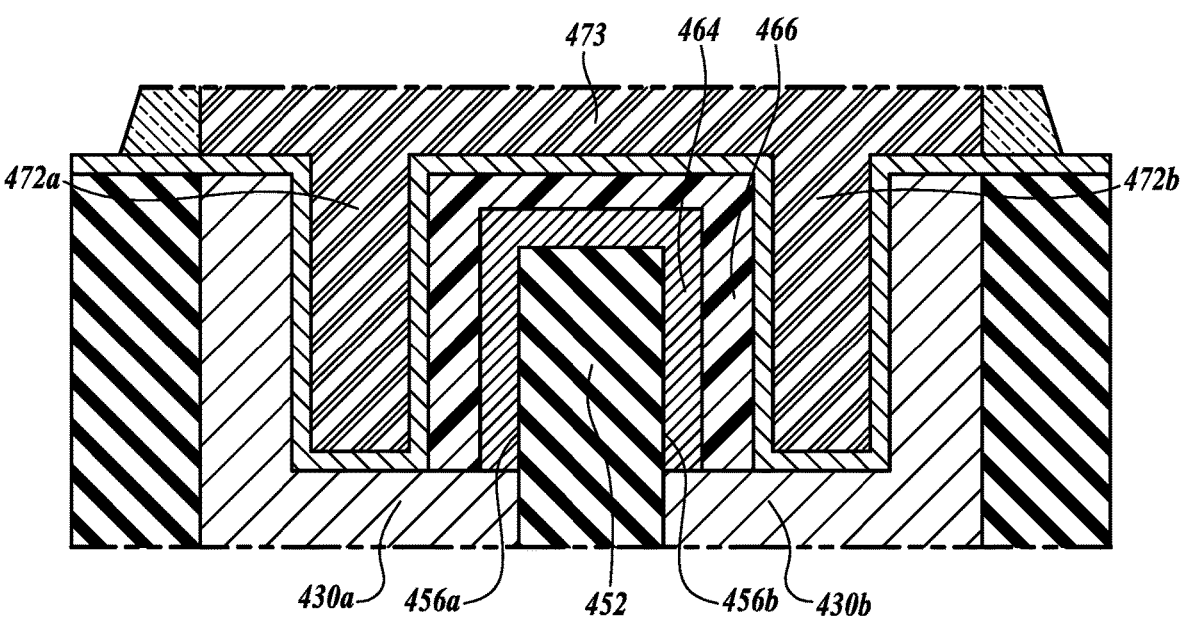
FIG. 4B shows a detail view of a portion of the transistor of FIG. 4A.

FIGS. 4A-B show another source follower transistor 450 according to the present disclosure. The source follower transistor 450 has the same features as source follower transistor 350 of FIGS. 3A-B except where noted below, and accordingly alike numbered-elements have alike meanings.

Source follower transistor 450 includes a nonplanar substrate structure 452 formed in the semiconductor substrate 414 as portions of semiconductor substrate 414. Like the source follower transistor 350 of FIGS. 3A-B, source follower transistor 450 has a channel doping layer 464 and an epitaxial overlayer 466 formed thereon. However, in the embodiment of FIGS. 4A-B, the channel doping layer 464 is itself formed as an epitaxial overlayer. Restated, the channel doping layer 464 is a channel doping epitaxial overlayer grown through an in situ epitaxial growth process on the sidewall portions 456a, b and tip portion of nonplanar substrate structure 452 as an epitaxial overlayer doped with a dopant (e.g., As) having a second conductive type which is opposite the first conductive type of the semiconductor substrate 414. As such, channel doping layer 464 and epitaxial overlayer 466 are formed within corresponding trenches 462a, 462b.

The epitaxial overlayer 466 (which may be considered a first epitaxial overlayer) is grown epitaxially as described above, but upon the epitaxially grown channel doping layer 464 (which may be considered a second epitaxial overlayer). In some embodiments, the epitaxial overlayer 466 is an un-doped layer. In some embodiments, the epitaxial overlayer 466 is doped with dopant of the same conductive type as the semiconductor substrate 414, and has similar doping concentration as the semiconductor substrate 414. Advantageously, this structure further reduces surface defects associated with the etching the surrounding channel isolation structures 430a, b.

In embodiments, the channel doping layer 464 has a thickness (e.g., between the sidewall portions 456a, b and the epitaxial overlayer 466) of about 1 nm to about 10 nm, about 2 nm to about 10 nm, about 3 nm to about 10 nm, about 4 nm to about 10 nm, about 5 nm to about 10 nm, about 6 nm to about 10 nm, about 7 nm to about 10 nm, about 8 nm to about 10 nm, about 9 nm to about 10 nm, about 1 nm to about 9 nm, about 1 nm to about 8 nm, about 1 nm to about 7 nm, about 1 nm to about 6 nm, about 1 nm to about 5 nm, about 1 nm to about 4 nm, about 1 nm to about 4 nm, about 1 nm to about 3 nm, or about 1 nm to about 2 nm.

Source follower transistor 450 has a planar gate portion 473 and two vertical gate electrodes 472a, b extending away therefrom. In the illustrated embodiment, planar gate portion 373 extends entirely over the channel isolation structures 430a, b. In other embodiments (e.g., as shown in FIG. 3A), the planar gate portion 473 extends partially over the channel isolation structures 430a, b.

As shown best in FIG. 4B, both the channel doping layer 464 and epitaxial overlayer 466 extend over a portion of each of the channel isolation structures 430a, b on opposite sides of the nonplanar substrate structure 452, as both are formed in the trenches 462a, 462b, which are trenches defined in corresponding channel isolation structures 430a, b. In the illustrated embodiments, channel doping layer 464, epitaxial overlayer 466, and vertical gate electrodes 472a, b of the gate of source follower transistor 450 are disposed in respective trenches 462a, 662b. The extent to which the channel doping layer 464 and epitaxial overlayer 466 extend over the channel isolation structures 430a, b is equal to the sum of the thicknesses of the channel doping layer 464 and epitaxial overlayer 466, since both are epitaxial overlayers. Restated, the channel doping layer 464 extends over the channel isolation structures 430a, b by a distance equal to its thickness, and the epitaxial overlayer 466 extends over the channel isolation structures 430a, b by a distance equal to its thickness. When viewed as a whole, the nonplanar substrate structure 452 has a T-shape as a result of this characteristic.

The structures described above with respect to FIG. 3A-4B are representative and not limited to transistors having a single nonplanar substrate structure. In fact, the epitaxial overlayers may be grown on a plurality of nonplanar substrate structures defined by the corresponding plurality of trenches formed in the semiconductor substrate.

Figure 5A:
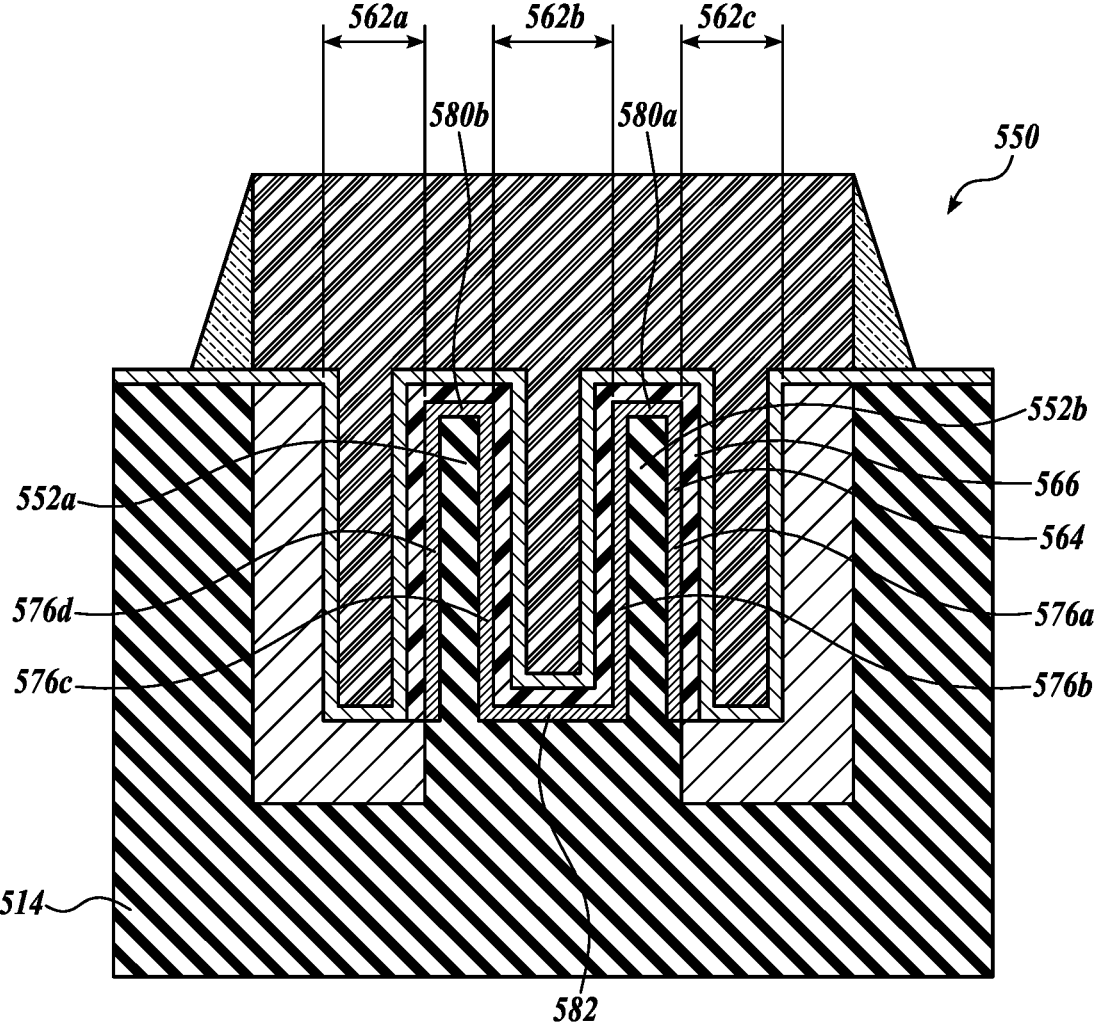
FIG. 5A shows a cross section of another alternative embodiment of a transistor in accordance with the teachings of the present disclosure.
Figure 5B:
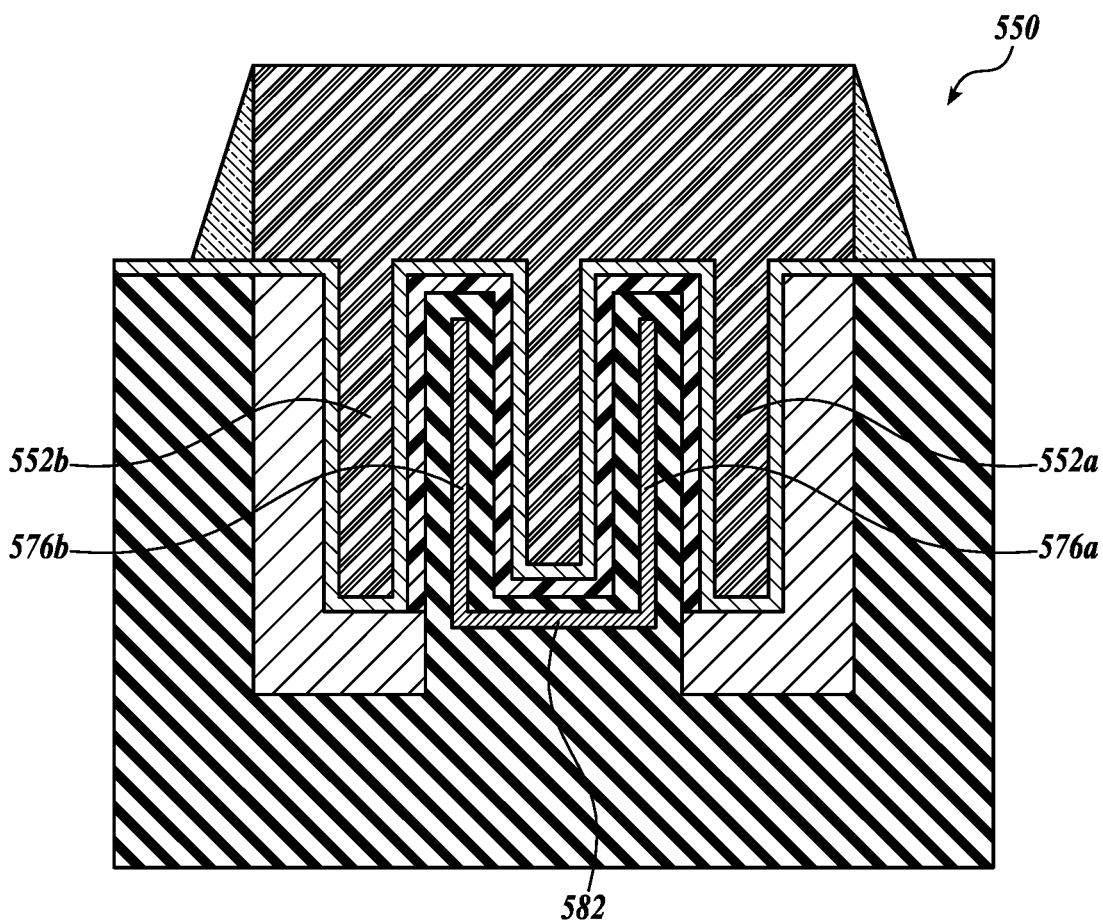
FIG. 5B shows a cross section of still another alternative embodiment of a transistor in accordance with the teachings of the present disclosure.

FIG. 5A-B show section views of an additional representative source follower transistor 550 having an epitaxial overlayer 566 epitaxially grown upon a plurality of nonplanar substrate structures 552a, b defined by the plurality of trenches 562 a, b, c for vertical gate electrodes in the semiconductor substrate 514. The number of nonplanar substrate structures shown is representative; in other embodiments, the number of nonplanar substrate structures may be even greater, e.g., three, four, or five. Except where described below, the source follower transistor 550 has the same features as the source follower transistor 350 and source follower transistor 450 of FIG. 3A-4B, respectively.

Each of FIGS. 5A and B show representative channel doping layer structures which may be applied to any transistor described herein. In each of FIGS. 5A and B, a channel doping layer 564 is formed in the regions of nonplanar substrate structures 552a, b in the semiconductor substrate 514, e.g., through an ion implantation process. In FIG. 5A, channel doping layer 564 has a shape that follows a contour of the nonplanar substrate structures 552a, b. In other words, the channel doping layer 564 extends adjacent and parallel to each sidewall portion; therefore, the channel doping layer 564 of FIG. 5A includes as many buried channel portions 576a-d as the number of sidewall portions (four in FIG. 5A) formed adjacent to the plurality of trenches for vertical gate electrodes. The buried channel portions 576a-d are joined by buried channel portions 580a,b and buried channel portion 582. By comparison, in FIG. 5B, the channel doping layer 564 includes a single buried channel portion 576a, b for each nonplanar substrate structure 552a, b; that is, the buried channel portions 576a, b each extend along a center of the corresponding nonplanar substrate structure 552a, b and are joined by buried channel portion 582. Restated, in some embodiments, the channel doping layer 564 has a U-shaped or square-wave shape surrounding the center vertical gate electrode and between the center vertical gate electrode and left and right vertical gate electrodes.

Figure 6:
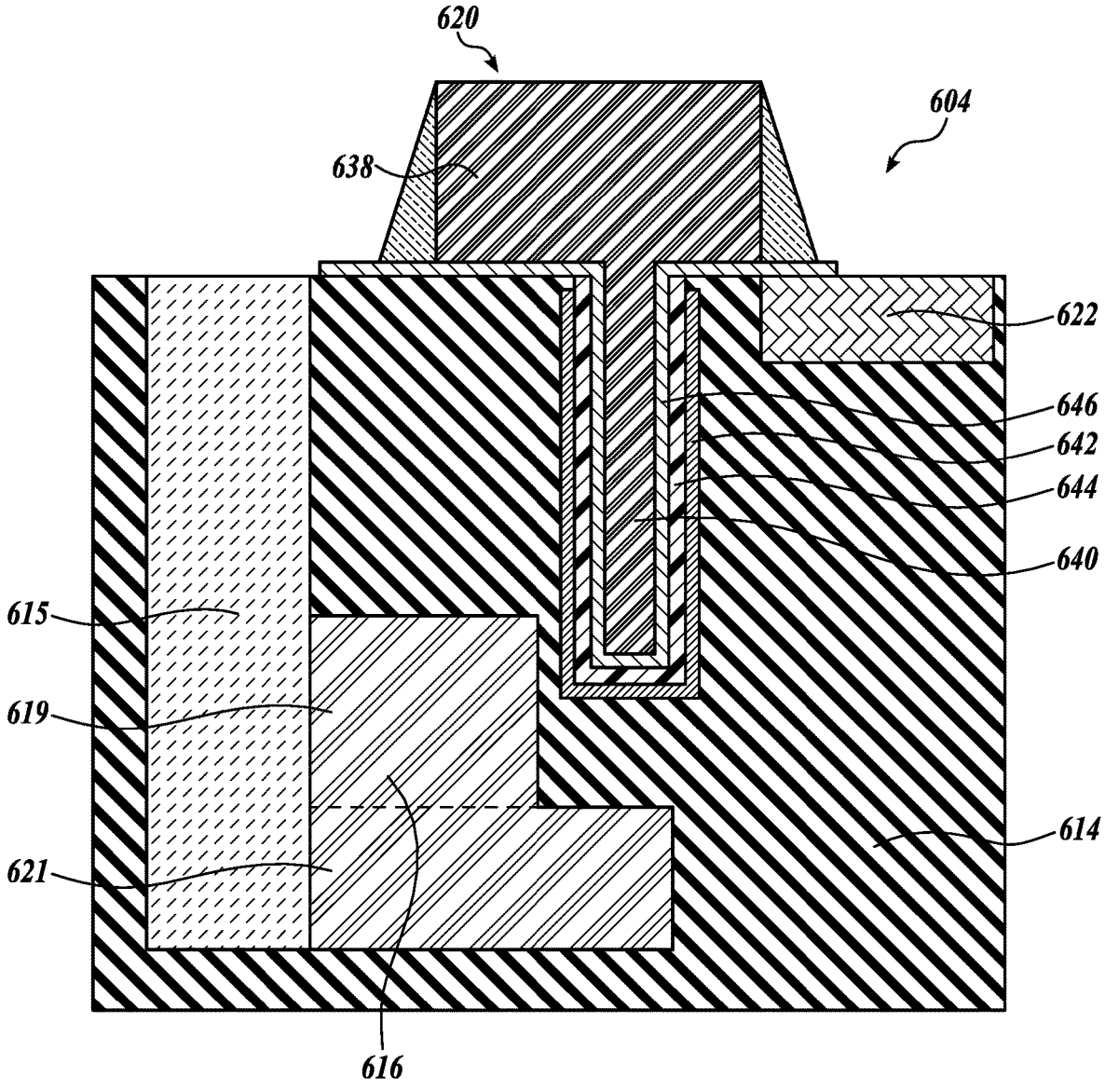
FIG. 6 shows a cross section of a portion of a pixel having a vertical transfer gate in accordance with the teachings of the present disclosure.

FIG. 6 illustrates a cross section of a portion of a pixel 604 according to another representative embodiment of the present disclosure. In particular, FIG. 6 shows a cross section of a portion of an active region of the pixel 604, which includes a photodiode 616 formed adjacent to a doped region 615 of a semiconductor substrate 614 having an opposite conductivity type as the photodiode 616. Doped region 615 may be an implanted isolation well region in the semiconductor substrate 614 between adjacent photodiodes (e.g., between adjacent photodiodes 216a-d shown in FIG. 2) and/or between photodiodes and transistor elements in the device transistor area, providing electrical isolation between adjacent photodiodes and between photodiodes and transistor elements in the device transistor area. The photodiode 616 is operably coupled by a transfer gate 620 to a floating diffusion 622, which in turn is coupled to a gate of a source follower transistor (not shown). The transfer gate 620 includes a planar gate 638 and a vertical transfer gate 640 extended from the planar gate 638. The photodiode 616, the transfer gate 620 and the floating diffusion 622 may form a transfer transistor, where the photodiode is a source of the transfer transistor and the floating diffusion region 622 is a drain of the transfer transistor.

The vertical transfer gate 640 includes epitaxially grown features similar to the source follower transistors of FIG. 3A-FIG. 5B. As shown, the transfer gate 620 includes a planar gate portion 638 and an elongate, monolith-shaped or pillar-shaped vertical transfer gate electrode 640 which extends vertically into the semiconductor substrate 614 toward photodiode 616 within an etched trench. The vertical transfer gate electrode 640 has a distal end located proximal to the photodiode 616 in order to transfer charge carriers from the photodiode 616 to the floating diffusion 622. In some embodiments, the photodiode 616 includes a doped photodiode region having a second conductive type (e.g., N-type) for accumulating photogenerated charges. The doped photodiode region includes a top photodiode section 619 and a bottom photodiode section 621, where the top photodiode section 619 and the bottom photodiode section 621 are of same conductive type (e.g., second conductive type opposite to a first conductive type of the semiconductor substrate 614). The top photodiode region 619 extends and adjoins bottom photodiode region 621. The top photodiode region 619 has an implanted depth being less than the extended depth of the vertical transfer gate 640. In one embodiment, the doped photodiode region has a L-shaped profile cross-section in a plane parallel to channel direction of a transfer transistor. In some embodiments, the photodiode 616 is disposed adjacent to isolation structure. In some embodiments, the vertical transfer gate electrode 640 extends by about 100 nm to about 500 nm into the semiconductor substrate 614. In any embodiment, the vertical transfer gate electrode 640 extends into the semiconductor substrate to a common depth as a first electrode and a second electrode of a gate of a source follower transistor. An isolation layer 646 separates the vertical transfer gate electrode 640 from the semiconductor substrate 614. In any embodiment, the isolation layer 646 has any of the features described above with respect to the isolation layers of FIG. 3A-FIG. 5B.

The etching process utilized to form the trench creates surface imperfections in sidewall portions of the trench, which would cause noise and degraded performance unless mitigated by the structures described below.

A channel doping layer 642 is formed around sidewall portions of the trench, e.g., through an ion implantation process. In any embodiment, the channel doping layer 642 surrounds the trench. In any embodiment, the channel doping layer 642 is formed by implanting ions through sidewall portions of the trench into the semiconductor substrate 614. In any embodiment, the channel doping layer 642 has a thickness of about 1 nm to about 10 nm, about 2 nm to about 10 nm, about 3 nm to about 10 nm, about 4 nm to about 10 nm, about 5 nm to about 10 nm, about 6 nm to about 10 nm, about 7 nm to about 10 nm, about 8 nm to about 10 nm, about 9 nm to about 10 nm, about 1 nm to about 9 nm, about 1 nm to about 8 nm, about 1 nm to about 7 nm, about 1 nm to about 6 nm, about 1 nm to about 5 nm, about 1 nm to about 4 nm, about 1 nm to about 4 nm, about 1 nm to about 3 nm, or about 1 nm to about 2 nm.

An epitaxial overlayer 644 is formed along the sidewall portions of the trench in between the channel doping layer 642 and the vertical transfer gate electrode 640 by epitaxially growing an overlayer material through a ultra-high vacuum chemical vapor deposition process or similar process. That is, the epitaxial overlayer 644 grows radially inward on all sides of the trench. In this way, the epitaxial overlayer 644 effectively mitigates the defects in the crystalline structure of the sidewall portions of the trench caused by the trench etching process, creating a new, smooth surface to which the isolation layer 646 bonds. The epitaxial overlayer 644 has any one or more of the properties described above with respect to epitaxial overlayers of the embodiments of FIG. 3A-FIG. 5B. For example, in any embodiment, the epitaxial overlayer 644 has a thickness between the channel doping layer 642 and the isolation layer 646 of about 1 nm to about 30 nm, about 1 nm to about 25 nm, about 1 nm to about 20 nm, about 1 nm to about 15 nm, about 1 nm to about 10 nm, about 1 nm to about 5 nm, about 5 nm to about 30 nm, about 10 nm to about 30 nm, about 15 nm to about 30 nm, about 20 nm to about 30 nm, or about 25 nm to about 30 nm.

FIG. 7 illustrates a representative method 700 of forming transistors according to the present disclosure, for example the source follower transistors of FIG. 3A-FIG. 5B. Terminology used below has alike meanings as alike terminology introduced above, and accordingly any feature described below may have any one or more characteristics of alike features previously described above.

In step 702, at least a first channel isolation structure and a second channel isolation structure are formed a semiconductor substrate in a laterally spaced apart configuration in a channel width direction, thereby defining at least one nonplanar substrate structure in the semiconductor substrate. The first channel isolation structure and a second channel isolation structure may extend along channel length direction of a transistor. In any embodiment, step 702 may include any one or more of: providing a semiconductor substrate, positioning a first mask over the semiconductor substrate, etching at least two spaced apart and parallel trenches (e.g., two, three, four, or five trenches) in the semiconductor substrate to a depth of about 150 nm to about 400 nm with respect to a front surface of the semiconductor substrate, depositing a dielectric material e.g., oxide material into any one or more of the trenches, and/or removing the first mask. In any embodiment, step 702 may include forming a source and a drain in the semiconductor substrate at opposite ends of the nonplanar substrate structure(s) by ion implantation.

In step 704, a first trench is formed in the first channel isolation structure and a second trench is formed in the second channel isolation structure, thereby exposing sidewall portions of the at least one nonplanar substrate structure. In any embodiment, step 704 may include using a plasma dry etching, or SiCoNi or similar process to form the first trench and the second trench. In any embodiment, step 704 may include any one or more of: positioning a second mask covering the nonplanar substrate structure and with openings on portion of the first channel isolation structure and the second channel isolation structure, etching the first trench in the first channel isolation structure and the second trench in the second channel isolation structure to a depth of 150 nm to 400 nm, and/or removing the second mask by a strip and clean process.

In step 706, a channel doping layer is formed in the nonplanar substrate structure. In any embodiment, step 706 may include implanting ions through sidewall portions of the first and second trenches into nonplanar substrate structure portion of the semiconductor substrate, optionally at a concentration which is less than a concentration of the source or the drain formed in the semiconductor substrate. In some embodiments, step 706 may include epitaxially growing a channel doping epitaxial overlayer in the first and second trenches on sidewall portions of the nonplanar substrate structure such that the channel doping layer extends over a portion of the first channel isolation structure and the second channel isolation structure. In any such embodiment in which the channel doping layer is epitaxially grown, the channel doping layer may be formed using an ultra-high vacuum chemical vapor deposition process to deposit a material in-situ doped with a dopant (e.g., As) having a second conductive type which is opposite the first conductive type of the semiconductor substrate inside the first and second trenches. In any embodiment, the channel doping layer is formed to any thickness described above with respect to any previously-introduced channel doping layer. In any embodiment, the channel doping layer, the first trench, and the second trench are formed over a same mask (e.g., the second mask). In any embodiment, step 706 may include forming a source and a drain in the semiconductor substrate at opposite ends of the nonplanar substrate structure(s) by ion implantation.

In step 708, an epitaxial overlayer is grown in the first trench and the second trench using the portions of nonplanar substrate structure in semiconductor substrate adjacent to sidewall portions of the first and second trenches as seed layer for epitaxial growth, thereby enclosing the channel doping layer in the nonplanar substrate structure. In any embodiment, the epitaxial overlayer is formed on sidewall portions of the nonplanar substrate structure. In some embodiments, the epitaxial overlayer is formed on an epitaxially formed channel doping layer. In some embodiments, the epitaxial overlayer is formed using an ultra-high vacuum chemical vapor deposition process to deposit an overlayer material which is the same as the semiconductor substrate. In any embodiment, the overlayer material is deposited to any thickness described above with respect to any epitaxial overlayer.

In optional step 710, an isolation layer is formed on the epitaxial overlayer, and a gate is formed on the isolation layer by depositing a gate material on the isolation layer and in the first and second trenches/recesses formed in first channel isolation structure and the second channel isolation structure. In any embodiment, the isolation layer is formed by depositing a dielectric material such as an oxide or high-k material, e.g., a material having a dielectric constant that is greater than about 3.9 (e.g., $Al_2O_3$ or $HfO_2$). In any embodiment, forming the gate includes forming an optional spacer around the gate material.

Figure 8:
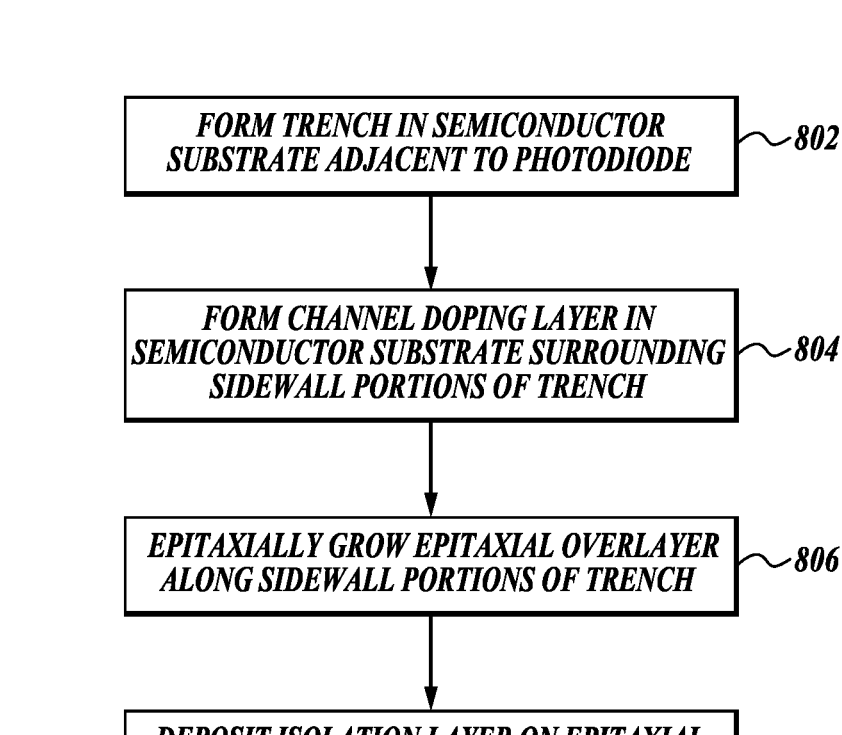
FIG. 8 illustrates a method of forming a transfer gate in accordance with the teachings of the present disclosure.

FIG. 8 illustrates a representative method 800 of forming a transfer gate having a vertical transfer gate according to the present disclosure, for example the vertical transfer gate of FIG. 6. Terminology used below has alike meanings as alike terminology introduced above, and accordingly any feature described below may have any one or more characteristics of alike features previously described above.

In step 802, a trench is formed in a semiconductor substrate adjacent to a photodiode, e.g., a slender, monolith-shaped trench or pillar-shaped trench which extends vertically into a semiconductor substrate by about 100 nm to about 500 nm.

In step 804, a channel doping layer is formed in the semiconductor substrate surrounding sidewall portions of the trench. In some embodiments, the channel doping layer is formed using an ion implantation process to implant ions through the sidewall portions of the trench into the semiconductor substrate. In any embodiment, the channel doping layer surrounds the trench for the vertical transfer gate. In some embodiments, the channel doping layer is formed by epitaxially growing the channel doping layer on sidewall portions of the trench using the portions of semiconductor substrate adjacent to sidewall portions of the trench as seed layer, e.g., using a vacuum chemical vapor deposition process to deposit a material doped with a dopant (e.g., As) having a second conductive type which is opposite the first conductive type of the semiconductor substrate. In any embodiment, the channel doping layer is formed to any thickness described above with respect to any channel doping layer.

In step 806, an epitaxial overlayer is formed along the sidewall portions of the trench. In any embodiment, the epitaxial overlayer is formed by epitaxially growing an overlayer material by using a vacuum chemical vapor deposition process or similar process to deposit an overlayer material which may be the same material as the semiconductor substrate. In any embodiment, the epitaxial overlayer is formed such that it grows radially inward on all sides of the trench and enclosing the channel doping layer. In any embodiment, the overlayer material is deposited to any thickness described above with respect to any channel doping layer.

In step 808, an isolation layer is formed in the trench over the epitaxial overlayer, and a gate is formed in the trench over the isolation layer. In some embodiment, the isolation layer is formed by depositing a dielectric material such as an oxide or high-k material, e.g., a material having a dielectric constant that is greater than about 3.9 (e.g., $Al_2O_3$ or $HfO_2$). In some embodiments, the isolation layer is formed by thermal oxidation process. In any embodiment, the transfer gate is formed by depositing a gate material comprising a polysilicon or a metal into the trench on the isolation layer to form a vertical portion of the transfer gate, and onto a surface of the semiconductor substrate to form a planar portion of the transfer gate. In some embodiments, forming the gate includes forming an optional spacer around the planar portion of the transfer gate.

Advantageously, the structures and methods described herein provide transistors with reduced noise and improved channel performance. Although the present disclosure describes the inventive structures in the context of source follower transistors and vertical transfer gates, these applications are representative and non-limiting.

What is claimed is:

1. A transistor formed in a semiconductor substrate, comprising:
    a plurality of trenches formed in the semiconductor substrate having a first conductive type, the plurality of trenches defining, in the semiconductor substrate, in a channel width plane of the transistor, a nonplanar substrate structure comprising a plurality of sidewall portions and a tip portion disposed between the plurality of sidewall portions,
    an epitaxial overlayer comprising an overlayer material epitaxially grown within the plurality of trenches and on the plurality of sidewall portions and the tip portion of the nonplanar substrate structure;
    a channel doping layer comprising a doped portion of the semiconductor substrate formed in the nonplanar substrate structure and enclosed by the epitaxial overlayer, wherein the channel doping layer is implanted into the plurality of sidewall portions and the tip portion of the nonplanar substrate structure, wherein the channel doping layer is a square wave shape that encloses the tip portion and at least partially encloses the plurality of sidewall portions of the nonplanar substrate structure, wherein the square wave shape of the channel doping layer conforms to the nonplanar substate structure, and wherein a bottom of the square wave shape terminates at a same depth as the isolation layer;
    an isolation layer disposed in the plurality of trenches and over the epitaxial overlayer; and
    a gate disposed on the isolation layer and extending into the plurality of trenches;
    wherein the isolation layer and epitaxial overlayer are arranged to physically separate the channel doping layer from the gate.

2. The transistor of claim 1, wherein the epitaxial overlayer has a thickness between the isolation layer and channel doping layer of five nanometers to thirty nanometers.

3. The transistor of claim 2, wherein the channel doping layer has a second thickness of one nanometer to ten nanometers.

4. The transistor of claim 1, wherein the epitaxial overlayer and the channel doping layer have a shape that follows a profile of the nonplanar substrate structure in the channel width plane.

5. The transistor of claim 1, wherein the overlayer material is a same material as the semiconductor substrate.

6. The transistor of claim 1, wherein the epitaxial overlayer is a first epitaxial overlayer,
    wherein the channel doping layer comprises a second epitaxial overlayer formed of an in situ epitaxially grown overlayer doped with a dopant having a second conductive type which is opposite the first conductive type,
    wherein the first epitaxial overlayer is disposed on the second epitaxial overlayer.

7. The transistor of claim 6, wherein the first epitaxial overlayer is un-doped.

8. The transistor of claim 1, further comprising a first channel isolation structure and a second channel isolation structure disposed on opposite sides of the nonplanar substrate structure, wherein the plurality of trenches comprises a first trench and a second trench, wherein the first channel isolation structure is disposed in the first trench and the second channel isolation structure is disposed in the second trench, and wherein the epitaxial overlayer extends over a portion of the first channel isolation structure in the first trench and over a portion of the second channel isolation structure in the second trench.

9. The transistor of claim 8, further comprising a third trench formed in the first channel isolation structure and a fourth trench formed in the second channel isolation structure, wherein the gate comprises a first vertical gate portion extending into the third trench and a second vertical gate portion extending into the fourth trench.

10. The transistor of claim 9, wherein the epitaxial overlayer extends into the third trench and on the first channel isolation structure and into the fourth trench and on the second channel isolation structure.

11. The transistor of claim 10, wherein the first channel isolation structure and the second channel isolation structure are shallow trench isolation structures.

12. The transistor of claim 1, wherein the nonplanar substrate structure is a first nonplanar substrate structure and the channel doping layer is a first channel doping layer,
    wherein the plurality of trenches define, in the semiconductor substrate, in the channel width plane of the transistor, a second nonplanar substrate structure comprising a plurality of sidewall portions,
    wherein the overlayer material of the epitaxial overlayer is epitaxially grown on the second nonplanar substrate structure and encloses a second channel doping layer comprising a doped portion of the semiconductor substrate formed in the second nonplanar substrate structure.

13. An image sensor, comprising:
    a photodiode formed in a semiconductor substrate;
    a transfer transistor coupled to the photodiode and to a floating diffusion, the transfer transistor being operative to transfer charge carriers from the photodiode to the floating diffusion; and
    the transistor of claim 1, wherein the transistor is a source follower transistor, and wherein the gate is coupled to the floating diffusion.

14. A semiconductor device, comprising:
    a semiconductor substrate of a first conductive type having an active region and a transistor region comprising a transistor;
    a first channel isolation structure disposed between the active region and the transistor region along a channel length direction of the transistor, and a second channel isolation structure disposed in parallel to the first channel isolation structure and spaced apart from the first channel isolation structure;

wherein the transistor comprises:

a planar gate disposed on a surface of semiconductor substrate and over the first channel isolation structure and the second channel isolation structure;

a first gate electrode extending from the planar gate into the first channel isolation structure;

a second gate electrode extending from the planar gate into the second channel isolation structure;

an isolation layer between the semiconductor substrate and the planar gate, between the first gate electrode, the second gate electrode, and the semiconductor substrate;

a plurality of trenches formed in the semiconductor substrate, the plurality of trenches defining, in the semiconductor substrate, in a channel width plane of the transistor, a nonplanar substrate structure comprising a plurality of sidewall portions and a tip portion disposed between the plurality of sidewall portions a channel doping layer in the semiconductor substrate adjacent to the planar gate, the first gate electrode, and the second gate electrode, wherein the channel doping layer has a second conductive type opposite to the first conductive type, wherein the channel doping layer is implanted into the plurality of sidewall portions and the tip portion of the nonplanar substrate structure, wherein the channel doping layer is a square wave shape that encloses the tip portion and at least partially encloses the plurality of sidewall portions of the nonplanar substrate structure, wherein the square wave shape of the channel doping layer conforms to the nonplanar substate structure, and wherein a bottom of the square wave shape terminates at a same depth as the isolation layer;

an epitaxial overlayer of the semiconductor substrate enclosing the channel doping layer wherein the epitaxial overlayer extends over a portion of the first channel isolation structure in a first trench and over a portion of the second channel isolation structure in a second trench; and a source and a drain disposed in the semiconductor substrate along the channel length direction on opposite sides of the planar gate;

wherein the isolation layer and epitaxial overlayer are arranged to physically separate the channel doping layer from the planar gate.

15. The semiconductor device of claim 14, wherein each of the first channel isolation structure and the second channel isolation structure comprise a trench partially filled with a dielectric material, wherein each of the first gate electrode and the second gate electrode is positioned on the dielectric material, wherein the epitaxial overlayer extends into the trench of each of the first channel isolation structure and the second channel isolation structure separating the first gate electrode and the second gate electrode from the channel doping layer.

16. The semiconductor device of claim 14, wherein the active region includes at least a photodiode, a floating diffusion, and a transfer gate coupling the photodiode to the floating diffusion, wherein the transistor is a source follower transistor, wherein the planar gate, the first gate electrode and the second gate electrode are electrically connected to the floating diffusion.

17. The semiconductor device of claim 14, wherein the transfer gate includes at least a vertical transfer gate electrode that extends from the surface into the semiconductor substrate and a second channel doping layer disposed in the semiconductor substrate surrounding the vertical transfer gate electrode; wherein the vertical transfer gate electrode is separated from the second channel doping layer by a second epitaxial overlayer.

18. The semiconductor device of claim 17, wherein the epitaxial overlayer, the second epitaxial overlayer, and the semiconductor substrate are formed of a same material.

19. The semiconductor device of claim 14, wherein the channel doping layer, the first gate electrode, and the second gate electrode extend into the semiconductor substrate to a common depth.

20. The semiconductor device of claim 14, wherein the epitaxial overlayer is a first epitaxial overlayer disposed upon a second epitaxial overlayer, wherein the second epitaxial overlayer is the channel doping layer, wherein the first epitaxial overlayer is a un-doped layer and the second epitaxial overlayer is doped with dopant of the second conductive type.

21. The semiconductor device of claim 14, wherein each of the first gate electrode and the second gate electrode extends a first gate width along a channel width plane of the transistor, wherein the first gate width is less than a width of the planar gate in the channel width plane.

* * * * *